US008829620B2

(12) United States Patent
Galy et al.

(10) Patent No.: US 8,829,620 B2
(45) Date of Patent: Sep. 9, 2014

(54) TRANSISTOR WITH ADJUSTABLE SUPPLY AND/OR THRESHOLD VOLTAGE

(75) Inventors: Philippe Galy, Le Touvet (FR); Jean Jimenez, Saint Théoffrey (FR)

(73) Assignee: STMicroelectronics SA, Montrouge (FR)

( * ) Notice: Subject to any disclaimer, the term of this patent is extended or adjusted under 35 U.S.C. 154(b) by 134 days.

(21) Appl. No.: 13/435,070

(22) Filed: Mar. 30, 2012

(65) Prior Publication Data

US 2012/0248542 A1  Oct. 4, 2012

(30) Foreign Application Priority Data

Apr. 1, 2011  (FR) ...................................... 11 52823

(51) Int. Cl.
| H01L 21/70 | (2006.01) |
| H01L 29/78 | (2006.01) |
| H01L 21/76 | (2006.01) |
| H01L 27/088 | (2006.01) |
| H01L 21/8234 | (2006.01) |
| H01L 21/8238 | (2006.01) |
| H01L 27/092 | (2006.01) |

(52) U.S. Cl.
CPC . *H01L 21/823437* (2013.01); *H01L 21/823828* (2013.01); *H01L 27/088* (2013.01); *H01L 27/0922* (2013.01); *H01L 21/823431* (2013.01)

USPC ............ 257/368; 257/333; 257/506; 438/424

(58) Field of Classification Search
None
See application file for complete search history.

(56) References Cited

U.S. PATENT DOCUMENTS

| 2007/0001219 A1* | 1/2007 | Radosavljevic et al. ...... 257/327 |
| 2009/0142889 A1 | 6/2009 | Vora et al. |
| 2009/0179266 A1 | 7/2009 | Abadeer et al. |
| 2009/0179268 A1 | 7/2009 | Abou-Khalil et al. |
| 2010/0213517 A1* | 8/2010 | Sonsky et al. ................. 257/288 |
| 2011/0006369 A1* | 1/2011 | Sonsky et al. ................. 257/347 |

* cited by examiner

*Primary Examiner* — Mark Tornow
*Assistant Examiner* — Priya Rampersaud
(74) *Attorney, Agent, or Firm* — Allen, Dyer, Doppelt, Milbrath & Gilchrist, P.A.

(57) ABSTRACT

The first electrode of the transistor may include a first electrically conductive region provided within the semiconductor substrate. The second electrode may include a second electrically conductive region provided within the semiconductor substrate. The first and second regions may be separated by the substrate region, and the control electrode may include a third electrically conductive region provided within the substrate. The third electrically conductive region may be both separated from the substrate region by an insulating region and electrically coupled to the substrate region by a junction diode intended to be reverse-biased.

23 Claims, 3 Drawing Sheets

TRANSISTOR WITH ADJUSTABLE SUPPLY AND/OR THRESHOLD VOLTAGE

FIELD OF THE INVENTION

The invention relates to integrated circuits, and more particularly, to insulated-gate field-effect transistors.

BACKGROUND OF THE INVENTION

Currently, transistors are manufactured for operating with low supply voltages, for example, less than 1 volt, or even for holding high voltages, typically between 2.5 and 8 volts. At the present time, to use higher supply voltages, transistors having thick oxide layers are produced. However, for a given technology, this may require additional steps and specific masks.

Another approach may comprise producing extended drain transistors. However, such transistors have a large footprint. Moreover, once the technology is fixed, the threshold voltage of the transistors is fixed.

SUMMARY OF THE INVENTION

According to one embodiment, a transistor topology may be provided for allowing the transistor to be readily powered with a high supply voltage, for example, 5 volts, while employing a fabrication technology meant for a lower supply voltage, for example, 1.8 volts, and providing flexibility in terms of supply and/or threshold voltage without requiring the use of specific additional masks for its fabrication.

According to one aspect, an electronic device is provided that may comprise at least one transistor, the transistor comprising a first electrode, for example, the source, a second electrode, for example, the drain, a control electrode, for example, the gate, and a substrate semiconductor region between the first electrode and the second electrode. The first electrode may comprise a first electrically conductive region provided within the semiconductor substrate. The second electrode may comprise a second electrically conductive region provided within the semiconductor substrate. The first and second regions may be separated by the substrate region. The control electrode may comprise a third electrically conductive region provided within the substrate, and this third electrically conductive region may be both separated from the substrate region by an insulating region and electrically coupled to the substrate region by a junction diode intended to be reverse-biased.

Thus, the transistor, for example, may use a substrate semiconductor part as gate material. Moreover, the vertical sides of the substrate semiconductor parts may be used to couple the gate to the channel of the transistor located in the substrate region. Furthermore, the gate-oxide thickness may depend only on the width of the insulating region separating the gate semiconductor region from the substrate semiconductor region, this width simply being defined by an etch width. It is thus also possible to easily adjust the threshold voltage of the transistor simply by modifying the width of the trench separating the gate region from the substrate region, this trench being provided in the semiconductor substrate and then filled with an insulator.

Moreover, the fact that the control semiconductor region is electrically coupled to the substrate region via a junction diode intended to be reverse-biased makes it possible, when the substrate voltage is allowed to float, for the substrate potential to follow the gate potential, thereby enabling the threshold voltage of the transistor to be further lowered. The insulating region advantageously may comprise a field oxide. This insulating region is thus, for example, what is known by those skilled in the art as a shallow trench isolation (STI) provided in the substrate.

According to an embodiment, the device may comprise several transistors respectively possessing several first electrodes, several second electrodes, several substrate regions and one common control electrode, the third electrically conductive region of which is respectively separated from the substrate regions by insulating regions and electrically coupled to the substrate regions by several junction diodes intended to be reverse-biased. It is thus possible to produce transistors in a star pattern, for example. This is because the transistor topology defined above may be compatible with conventional CMOS/BiCMOS technology.

BRIEF DESCRIPTION OF THE DRAWINGS

Other advantages and features of the invention may become clear on examining the detailed description of non-limiting embodiments and the annexed drawings, in which.

DETAILED DESCRIPTION OF THE PREFERRED EMBODIMENTS

Figure 1:
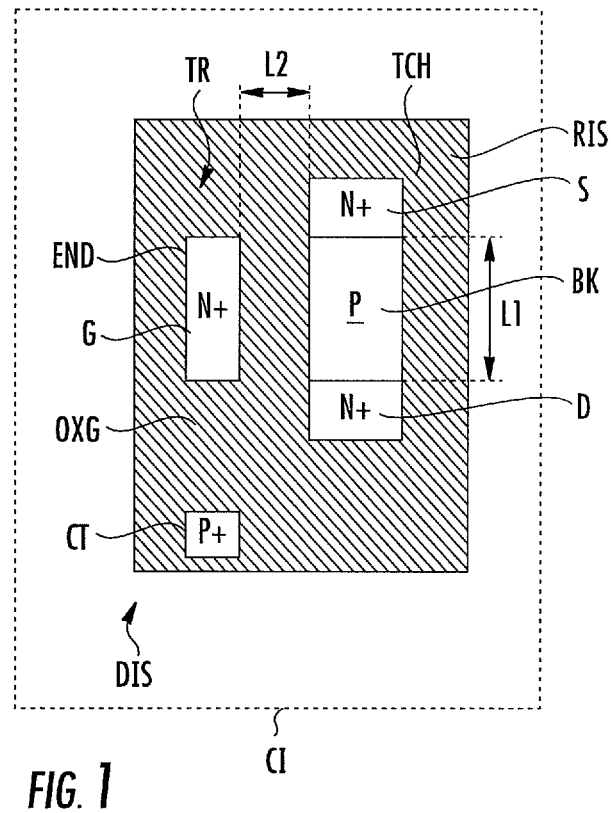
FIGS. 1 and 2 are schematic diagrams, respectively top plan and perspective view, of an embodiment of a device, according to the present invention.

In FIG. 1, the reference DIS denotes a schematic top view of a semiconductor device. In a semiconductor substrate, for example, a p-type substrate, a trench TCH, for example, a shallow trench, has been etched, for example, using a typical technique of the type employed to form shallow trench isolations (STIs). This trench TCH was then filled with a field oxide, for example, by oxide deposition or growth, so as to form an insulating region RIS, for example, an STI.

Moreover, the device DIS comprises a first semiconductor region S, which is $n^+$-doped, a second semiconductor region D which is $n^+$-doped, and a third semiconductor region G, which is also $n^+$-doped. These regions are, for example, obtained by implantation of the substrate. Between the first semiconductor region S and the second semiconductor region D, there is a p-type substrate region BK.

Figure 2:
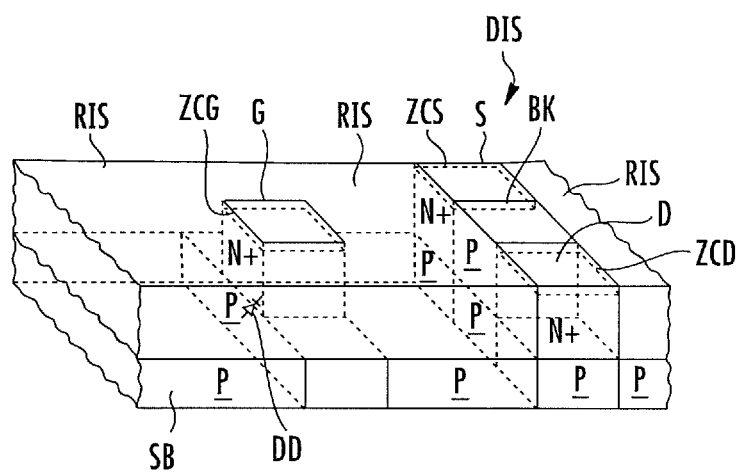

All these elements may be seen in FIG. 2, which is a schematic perspective view of the device of FIG. 1. The substrate SB may be a bulk substrate or else a p-type well in an n-type semiconductor wafer, or even a silicon-on-insulator (SOI) substrate. The first $n^+$-doped semiconductor region, referenced S, is therefore an electrically conductive region forming here a first electrode, for example, the source, of a field-effect transistor TR. The second $n^+$-doped semiconductor region, referenced D, is also an electrically conductive region and forms here a second electrode, for example, the drain, of the transistor TR.

The third $n^+$-doped semiconductor region, referenced G, is also an electrically conductive region and forms the control electrode, for example, the gate, of the transistor TR. The first electrode S moreover comprises a contact zone ZCS, for example, a silicided zone, allowing electrical contact to be made to this zone. Likewise, the second electrode D comprises, on the $n^+$ semiconductor region, a contact zone ZCD, for example, a silicided zone. The same is true of the control electrode G which comprises, on the n+ semiconductor zone, a silicided contact zone ZCG.

The substrate region BK, which lies between the source and the drain of the transistor TR, therefore comprises the channel of the transistor. The transistor TR comprises in this illustrative example an nMOS transistor. This being so, the invention of course equally applies also to a transistor with a p-type channel in which the source, drain and gate regions would be doped p+ and the substrate region BK would be an n-type region. This being so, it is also possible for the source, drain and gate regions to be entirely metallic regions so as to obtain metal/silicon junctions (Schottky diodes), thereby allowing the transistor to operate with extremely low supply voltages.

It may be seen in FIGS. 1 and 2 that the thickness of the gate oxide OXG is in fact defined by the width L2 of that part of the isolation trench TCH located between the semiconductor gate region G and the substrate region BK. Similarly, the length of the channel is defined here by the length L1 of the substrate region BK.

The length L2 can be readily adapted within a given technology because it is simply defined by the width of the trench etch. Likewise, the length L1 simply results from an implantation mask.

The transistor TR in this case employs, as gate region, a semiconductor region implanted within the substrate, and the vertical sides of the regions G and BK are used in operation of the transistor TR. It is therefore possible, within a given integrated circuit, to produce readily transistors TR having different threshold voltages and/or capable of holding different supply voltages, simply by modulating, from one transistor to another, the length L2 and optionally the length L1.

It may also be noted that the region forming the control electrode of the transistor is not only separated from the substrate region BK by an insulating region, namely the gate oxide OXG, but is also coupled to this substrate region BK via a diode DD (FIG. 2) that is intended to be reversed biased. Since the n-type gate zone G makes direct contact with the underlying p-type substrate SB (in a location END of the substrate different from the substrate region BK), the diode DD is a p-n junction diode, the cathode of which is turned towards the n-type zone and the anode of which is turned towards the p-type zone. A direct contact of the gate zone G with the underlying substrate in a location different from the substrate region BK may permit control of the channel by both the gate and the substrate leading to a better electrostatic control of the potential of the bulk BK.

When the gate G is biased with a gate voltage, and the substrate SB is allowed to float, the diode DD is reverse-biased and the substrate potential follows the gate potential because of the leakage currents. The potential of the substrate is lower than that of the gate and especially depends on the resistance of the substrate.

Allowing the substrate potential to float and follow the gate potential makes it possible to obtain a lower threshold voltage. This being so, for certain applications it may be advantageous to fix the substrate potential. For this purpose, as shown in FIG. 1, an electrically conductive contact zone CT, for example, a p+-doped silicided zone, coupled to the substrate SB and therefore to the substrate region BK, is provided.

Figure 3:
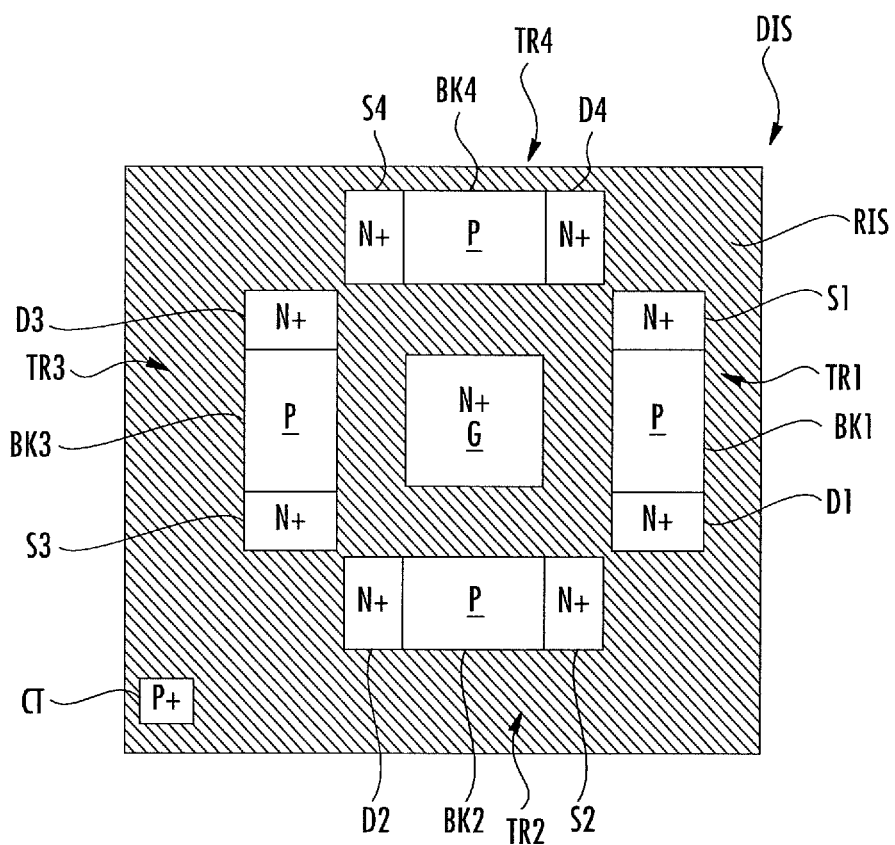
FIG. 3 is a top plan view schematic diagram of another embodiment of a device, according to the present invention.

It is also possible, as illustrated in FIG. 3, for the device to comprise several transistors, here four transistors TR1, TR2, TR3, TR4 respectively having several first electrodes S1-S4, several second electrodes D1-D4, several substrate regions BK1-BK4 and a common control electrode G, the third electrically conductive region of which is respectively separated from the substrate regions BKi by insulating regions RIS, while being electrically coupled to the substrate regions BKi by several junction diodes intended to be reverse-biased, analogously to the case described above. It is thus possible to produce transistors in any pattern, for example, in a star pattern.

Figure 4:
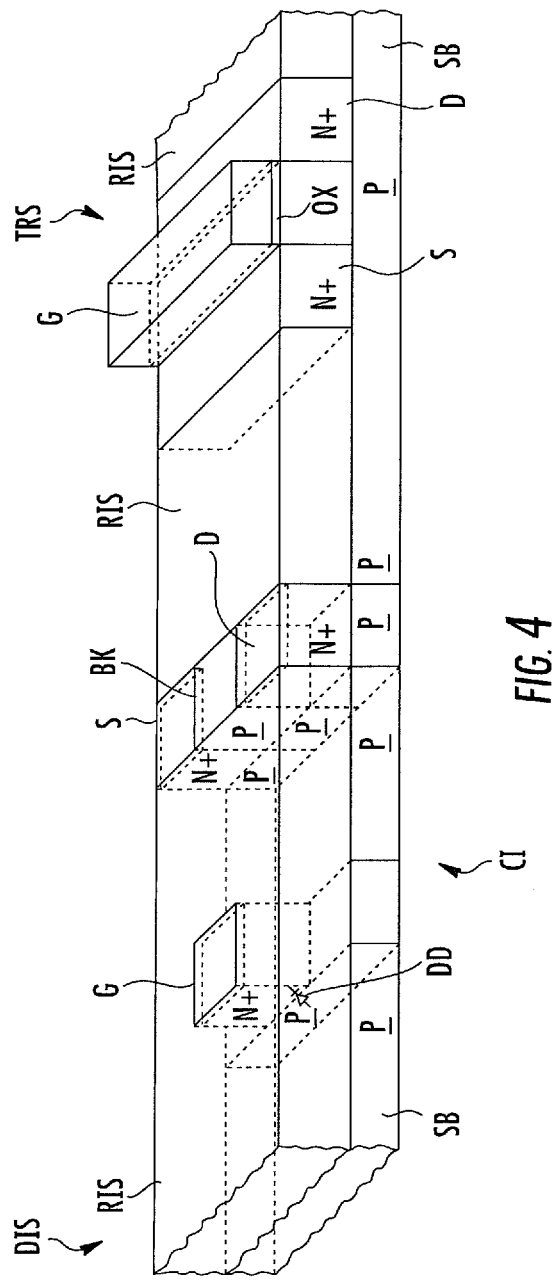
FIG. 4 is a perspective view schematic diagram of an integrated circuit, according to the present invention.

It is also possible, as illustrated schematically in FIG. 4, for an integrated circuit CI to comprise one or more devices DIS of the type described above and conventional transistors, for example, MOS transistors TRS having source, drain and channel regions provided in the substrate SB and gate regions G located on the substrate and separated from the channel region by a gate oxide OX. The device(s) DIS and the typical transistors TRS may be produced in one and the same CMOS-technology process. In other words, the device DIS in some embodiments may be compatible with CMOS/BiCMOS technology.

That which is claimed is:

1. An electronic device comprising:
   at least one transistor in a semiconductor substrate and comprising a first electrode, a second electrode, a control electrode, and a substrate region between said first and second electrodes;
   said first electrode comprising a first electrically conductive region in the semiconductor substrate;
   said second electrode comprising a second electrically conductive region in the semiconductor substrate;
   said first and second electrically conductive regions being separated by said substrate region;
   said control electrode comprising a third electrically conductive region in the semiconductor substrate, said third electrically conductive region directly contacting with another region of the semiconductor substrate;
   an insulating region separating said third electrically conductive region from said substrate region; and
   a junction diode configured to couple said third electrically conductive region to a portion of the semiconductor substrate directly under said third electrically conductive region and extending under said insulation region.

2. The electronic device according to claim 1 wherein said junction diode comprises a reverse-bias junction diode.

3. The electronic device according to claim 1 wherein said insulating region comprises an oxide.

4. The electronic device according to claim 1 wherein said insulating region comprises a shallow trench isolation in the semiconductor substrate.

5. The electronic device according to claim 1 wherein the semiconductor substrate has a first conductivity type; wherein said first electrically conductive region has a second conductivity type; and wherein said first electrode comprises a first electrically conductive contact coupled to said first electrically conductive region.

6. The electronic device according to claim 5 wherein said second electrically conductive region has the second conductivity type; wherein said second electrode comprises a second electrically conductive contact coupled to said second electrically conductive region;
   wherein said third electrically conductive region has the second conductivity type; and wherein said control electrode comprises a third electrically conductive contact coupled to said third electrically conductive region.

7. The electronic device according to claim 1 wherein at least one of said first, second, and third electrically conductive regions comprises a metallic region; and wherein if at least one of said first, second, and third electrically conductive regions is not metallic, the at least one non-metallic region comprises a semiconductor region having a conductivity type opposed to that of the semiconductor substrate.

8. The electronic device according to claim 1 further comprising an electrically conductive contact coupled to said substrate region.

9. The electronic device according to claim 1 wherein said at least one transistor comprises a plurality thereof, said plurality of transistors comprising a common control electrode coupled to each transistor.

10. An electronic device comprising:
at least one transistor in a semiconductor substrate and comprising
a first electrode comprising a first electrically conductive region in the semiconductor substrate,
a second electrode comprising a second electrically conductive region in the semiconductor substrate,
a substrate region between said first and second electrically conductive regions, and
a control electrode comprising a third electrically conductive region in the semiconductor substrate;
an insulating region separating said third electrically conductive region from said substrate region; and
a junction diode configured to couple said third electrically conductive region to a portion of the semiconductor substrate directly under said third electrically conductive region and extending under said insulation region.

11. The electronic device according to claim 10 wherein said insulating region comprises an oxide.

12. The electronic device according to claim 10 wherein said insulating region comprises a shallow trench isolation in the semiconductor substrate.

13. The electronic device according to claim 10 wherein said third electrically conductive region in the semiconductor substrate directly contacts with another region of the semiconductor substrate.

14. An integrated circuit (IC) comprising:
an electronic device comprising
at least one transistor in a semiconductor substrate, said at least one transistor comprising
a first electrode comprising a first electrically conductive region in the semiconductor substrate,
a second electrode comprising a second electrically conductive region in the semiconductor substrate,
a substrate region between said first and second electrically conductive regions, and
a control electrode comprising a third electrically conductive region in the semiconductor substrate,
an insulating region separating said third electrically conductive region from said substrate region, and
a junction diode configured to couple said third electrically conductive region to a portion of the semiconductor substrate directly under said third electrically conductive region and extending under said insulation region; and
at least one other transistor comprising a source, a drain, a channel therebetween in the semiconductor substrate, and a gate above the semiconductor substrate and the channel region.

15. The IC according to claim 14 wherein said insulating region comprises an oxide.

16. The IC according to claim 14 wherein said insulating region comprises a shallow trench isolation in the semiconductor substrate.

17. The IC according to claim 14 wherein said third electrically conductive region in the semiconductor substrate directly contacts with another region of the semiconductor substrate.

18. The IC according to claim 14 wherein the semiconductor substrate has a first conductivity type; wherein said first electrically conductive region has a second conductivity type; and wherein said first electrode comprises a first electrically conductive contact coupled to said first electrically conductive region.

19. A method for making an electronic device comprising:
forming at least one transistor in a semiconductor substrate, the at least one transistor comprising
a first electrode comprising a first electrically conductive region in the semiconductor substrate,
a second electrode comprising a second electrically conductive region in the semiconductor substrate,
a substrate region between the first and second electrically conductive regions, and
a control electrode comprising a third electrically conductive region in the semiconductor substrate;
forming an insulating region for separating the third electrically conductive region from the substrate region; and
forming a junction diode to couple the third electrically conductive region to a portion of the semiconductor substrate directly under the third electrically conductive region and extending under the insulation region.

20. The method according to claim 19 wherein the junction diode comprises a reverse-bias junction diode.

21. The-method according to claim 19 wherein the insulating region comprises an oxide.

22. The method according to claim 19 wherein forming the insulating region comprises forming a shallow trench isolation in the semiconductor substrate.

23. The method according to claim 19 wherein forming the third electrically conductive region comprises forming the third electrically conductive region in the semiconductor substrate to directly contact with another region of the semiconductor substrate.

* * * * *